United States Patent
Lee

(10) Patent No.: US 10,566,067 B2
(45) Date of Patent: Feb. 18, 2020

(54) SEMICONDUCTOR MEMORY DEVICE, STORAGE DEVICE HAVING THE SAME, AND METHOD OF OPERATING MEMORY CONTROLLER

(71) Applicant: SK hynix Inc., Gyeonggi-do (KR)

(72) Inventor: Hyung Min Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/191,793

(22) Filed: Nov. 15, 2018

(65) Prior Publication Data

US 2019/0304555 A1    Oct. 3, 2019

(30) Foreign Application Priority Data

Mar. 29, 2018 (KR) .................. 10-2018-0036822

(51) Int. Cl.
| | |
|---|---|
| *G11C 16/26* | (2006.01) |
| *G11C 16/34* | (2006.01) |
| *G11C 11/56* | (2006.01) |
| *G11C 16/24* | (2006.01) |
| *G11C 16/10* | (2006.01) |

(52) U.S. Cl.
CPC ...... *G11C 16/3454* (2013.01); *G11C 11/5628* (2013.01); *G11C 11/5642* (2013.01); *G11C 16/10* (2013.01); *G11C 16/24* (2013.01); *G11C 16/26* (2013.01)

(58) Field of Classification Search
CPC .............. G11C 13/004; G11C 11/5642; G11C 13/0064

See application file for complete search history.

(56) References Cited

U.S. PATENT DOCUMENTS

| | | | |
|---|---|---|---|
| 9,704,587 B1 * | 7/2017 | Park .................. | G11C 16/24 |
| 9,859,008 B1 * | 1/2018 | Kim .................. | G11C 16/10 |
| 2010/0246246 A1 * | 9/2010 | Kim .................. | G11C 11/5678 365/163 |
| 2015/0049547 A1 * | 2/2015 | Kim .................. | G11C 29/028 365/185.09 |
| 2015/0380086 A1 * | 12/2015 | Park .................. | G11C 13/0069 365/148 |
| 2016/0358648 A1 * | 12/2016 | Park .................. | G11C 13/004 |
| 2018/0166130 A1 * | 6/2018 | Intrater .............. | G11C 7/22 |
| 2019/0286442 A1 * | 9/2019 | Takizawa ........... | G11C 16/10 |
| 2019/0286518 A1 * | 9/2019 | Asami ............... | G11C 29/42 |

FOREIGN PATENT DOCUMENTS

| | | |
|---|---|---|
| KR | 101012982 | 2/2011 |
| KR | 1020120042274 | 5/2012 |
| KR | 1020160004557 | 1/2016 |

* cited by examiner

*Primary Examiner* — Tuan T Nguyen
(74) *Attorney, Agent, or Firm* — IP & T Group LLP

(57) ABSTRACT

The operation of a semiconductor memory device may be controlled by a method of operating a memory controller. The operating method may include transmitting a first read command to the semiconductor memory device, and determining whether to generate a discharge command based on the type of command waiting to be transmitted after the first read command.

15 Claims, 12 Drawing Sheets

SEMICONDUCTOR MEMORY DEVICE, STORAGE DEVICE HAVING THE SAME, AND METHOD OF OPERATING MEMORY CONTROLLER

CROSS-REFERENCE TO RELATED APPLICATION

The present application claims priority under 35 U.S.C. § 119(a) to Korean patent application number 10-2018-0036822, filed on Mar. 29, 2018, the entire disclosure of which is incorporated herein by reference in its entirety.

BACKGROUND

1. Field of Invention

Various embodiments of the present disclosure generally relate to an electronic device. Particularly, the embodiments relate to a memory controller and a semiconductor memory device.

2. Description Related Art

Generally, a memory device may have a two-dimensional structure in which strings are horizontally arranged on a semiconductor substrate, or a three-dimensional structure in which strings are vertically stacked on a semiconductor substrate. The three-dimensional memory device may be a device which is devised to overcome a limitation in the degree of integration of the two-dimensional memory device, and may include a plurality of memory cells which are vertically stacked on a semiconductor substrate.

SUMMARY

Various embodiments of the present disclosure are directed to a method of operating a memory controller capable of improving an operating speed of a semiconductor memory device.

Various embodiments of the present disclosure are directed to a storage device having an improved operating speed.

Various embodiments of the present disclosure are directed to a semiconductor memory device having an improved operating speed.

An embodiment of the present disclosure may provide for a method of operating a memory controller to control an operation of a semiconductor memory device. The method may include: transmitting a first read command to the semiconductor memory device; and determining whether to generate a discharge command based on a type of command waiting to be transmitted after the first read command.

In an embodiment, the determining may include determining not to generate the discharge command when the command waiting to be transmitted is a second read command. In this case, the method may further include transmitting the second read command to the semiconductor memory device after the determining.

In an embodiment, the determining may include determining to generate the discharge command when the command waiting to be transmitted is a program command or an erase command. In this case, the method may further include, after the determining, generating the discharge command and transmitting the discharge command to the semiconductor memory device, and transmitting to the semiconductor memory device the command waiting to be transmitted.

In an embodiment, the method may further include generating the discharge command and transmitting the discharge command to the semiconductor memory device after transmitting.

An embodiment of the present disclosure may provide for a storage device including: a semiconductor memory device including a voltage generator configured to generate a plurality of operating voltages; and a memory controller configured to control an operation of the semiconductor memory device. The memory controller may control the semiconductor memory device such that a precharge operation and a discharge operation of the voltage generator are omitted, when the semiconductor memory device performs successive read operations, between the successive read operations.

In an embodiment, the memory controller may control the semiconductor memory device to discharge the voltage generator based on a discharge command.

In an embodiment, the memory controller may determine, when the read operation of the semiconductor memory device is completed, whether to generate the discharge command based on a command waiting to be transmitted.

In an embodiment, the memory controller may transmit to the semiconductor memory device, when the command waiting to be transmitted is a read command, the command waiting to be transmitted, without generating the discharge command.

In an embodiment, the memory controller may generate, when the command waiting to be transmitted is not a read command, the discharge command and transmit the discharge command to the semiconductor memory device and then transmit to the semiconductor memory device the command waiting to be transmitted.

An embodiment of the present disclosure may provide for a semiconductor memory device including: a memory cell array; a voltage generator configured to generate a voltage for performing an operation on the memory cell array; and a control logic configured to control an operation of the voltage generator. The control logic may be configured to control a discharge operation of the voltage generator, based on a command received after a read operation on the memory cell array.

In an embodiment, the control logic may control, when a read command is received within a predetermined reference time after the read operation is completed, the voltage generator to perform a read operation corresponding to the received read command without performing the discharge operation of the voltage generator.

In an embodiment, the control logic may control, when a command other than a read command is received after the read operation is completed, the voltage generator to perform a discharge operation and a precharge operation and then perform an operation based on the received command.

In an embodiment, the control logic may control, when a command is not received within a predetermined reference time after the read operation is completed, the voltage generator to perform a discharge operation.

An embodiment of the present disclosure may provide for a semiconductor memory device comprising: a memory cell array; a voltage generator configured to generate a voltage for performing an operation on the memory cell array; and a control logic configured to control an operation of the voltage generator. The control logic may be configured to control a discharge operation of the voltage generator based on a command received after a read operation on the memory cell array.

An embodiment of the present disclosure may provide for a semiconductor memory device comprising: a memory cell array; a peripheral circuit; and a control logic configured to control the peripheral circuit to perform a read operation to the memory cell array. The control logic may control the peripheral circuit to perform a discharge operation for a preceding read operation and a precharge operation for a subsequent read operation when a read command is not provided for the subsequent read operation within a predetermined time after the preceding read operation is completed.

DETAILED DESCRIPTION

Figure 1:
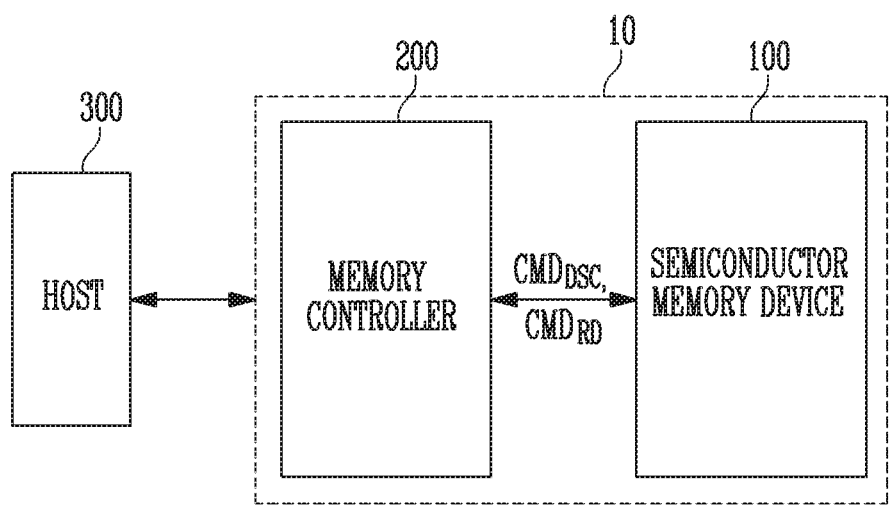
FIG. 1 is a block diagram illustrating a storage device including a semiconductor memory device in accordance with an embodiment of the present disclosure.

Various exemplary embodiments will now be described in more detail hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. It is noted that reference to "an embodiment" does not necessarily mean only one embodiment, and different references to "an embodiment" are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form and vice versa as long as it is not specifically mentioned as having only a singular form or a plural form. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a storage device 10 including a semiconductor memory device 100 in accordance with an embodiment of the present disclosure.

Referring FIG. 1, the storage device 10 includes the semiconductor memory device 100 and a memory controller 200. Furthermore, the storage device 10 may communicate with a host 300. The memory controller 200 may control the overall operation of the semiconductor memory device 100. In addition, the memory controller 200 may control the operation of the semiconductor memory device 100 based on a command received from the host 300.

The memory controller 200 in accordance with an embodiment of the present disclosure may transmit a discharge command $CMD_{DSC}$ and a read command $CMD_{RD}$ to the semiconductor memory device 100. The memory controller 200 may control a voltage generator 150 (refer to FIG. 2) to discharge a charge pump included therein in the semiconductor memory device 100 through the discharge command $CMD_{DSC}$. The charge pump may be configured of a circuit including a plurality of pumping capacitors. The memory controller 200 may control the semiconductor memory device 100 to perform a read operation to a memory cell array 110 (refer to FIG. 2) included therein through the read command $CMD_{RD}$.

A typical memory controller 200 merely transmits a read command $CMD_{RD}$ for a read operation to the semiconductor memory device 100 but does not transmit a separate command for precharge or discharge of the charge pump. In this case, the semiconductor memory device 100 controls a precharge operation and a discharge operation of the voltage generator in response to a received read command $CMD_{RD}$. Operating voltages for a read operation differ from operating voltages for a program operation or an erase operation. Hence, after a single read operation has been performed, the charge pump of the voltage generator is discharged to prepare for a subsequent operation.

In the case where a plurality of read commands $CMD_{RD}$ are successively transmitted to the semiconductor memory device 100, the semiconductor memory device 100 precharges and discharges the charge pump of the voltage generator right before and right after each of a plurality of read operations respectively corresponding to the plurality of read commands $CMD_{RD}$. That is, the precharge and discharge operations are performed as many times as the number of the plurality of read commands $CMD_{RD}$. Therefore, unnecessary discharge operations and precharge operations are repeatedly performed, reducing the overall read speed.

The memory controller 200 in accordance with an embodiment of the present disclosure may provide a discharge command $CMD_{DSC}$ to the semiconductor memory device 100 to control, not by the voltage generator 150 but by the memory controller 200, a discharge operation of the charge pump included in the voltage generator (not shown) of the semiconductor memory device 100. Thus, when successive read commands $CMD_{RD}$ are transmitted to the semiconductor memory device 100, unnecessary discharge operation and precharge operation of the voltage generator may be omitted. Consequently, the time required to perform a read operation is reduced, so that the overall operating speed of the storage device 10 may be enhanced.

Figure 2:
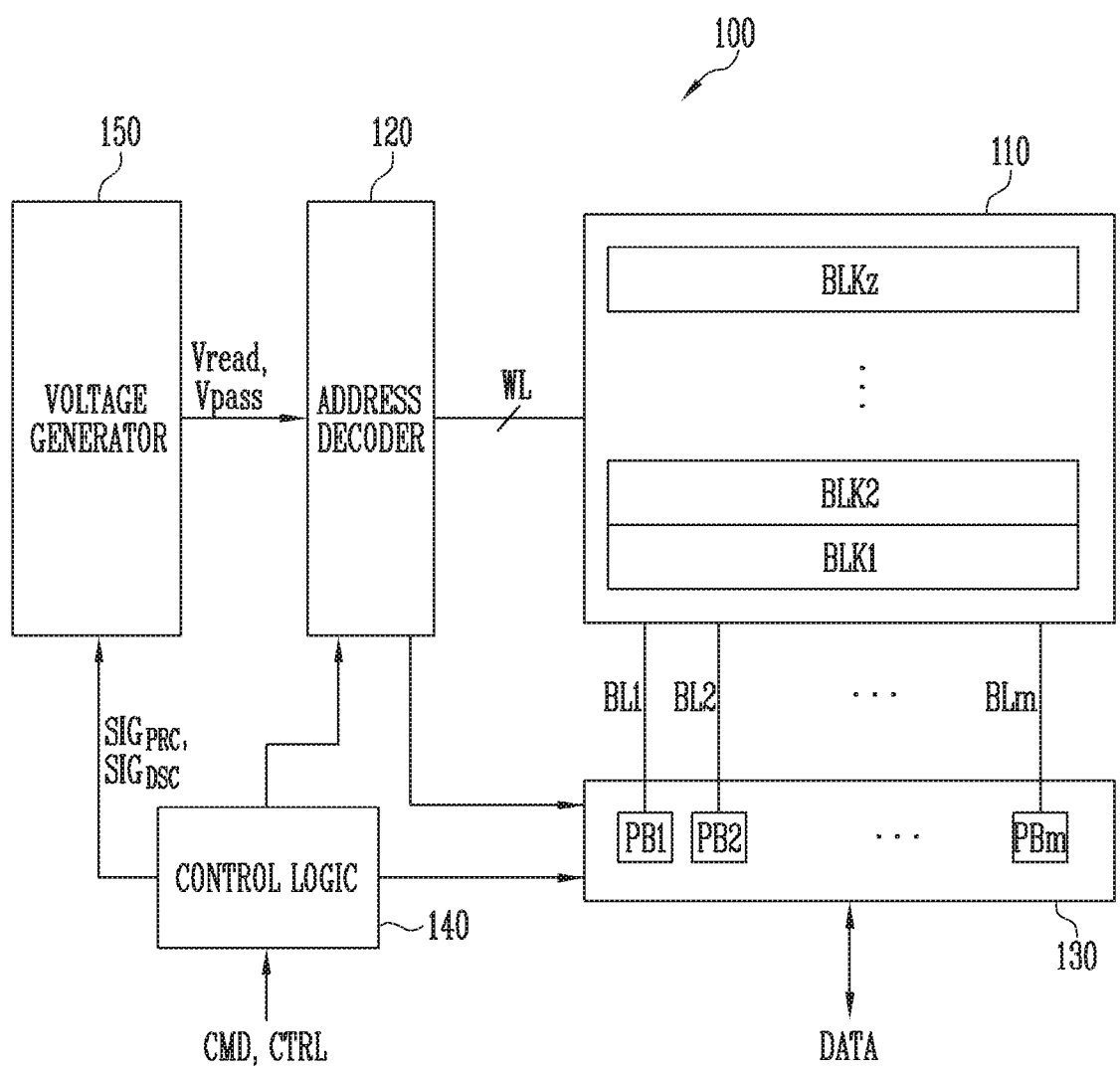
FIG. 2 is a block diagram illustrating the semiconductor memory device in accordance with an embodiment of the present disclosure.

FIG. 2 is a block diagram illustrating the semiconductor memory device 100 in accordance with an embodiment of the present disclosure.

Referring to FIG. 2, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the memory cells may be nonvolatile memory cells and be formed of nonvolatile memory cells having a vertical channel structure. The memory cell array 110 may be formed of a memory cell array having a two-dimensional or a three-dimensional structure. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In various embodiments, the memory cell array 110 may include a plurality of memory cells each of which stores 5 or more bits of data.

The address decoder 120, the read/write circuit 130, the control logic 140, and the voltage generator 150 are operated as peripheral circuits for driving the memory cell array 110. The address decoder 120 is coupled to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 may select at least one memory block based on the decoded block address. When a read voltage application operation is performed during a read operation, the address decoder 120 may apply a read voltage Vread generated from the voltage generator 150, to a selected word line of a selected memory block and apply a pass voltage Vpass to the other unselected word lines. During a program verify operation, the address decoder 120 may apply a verify voltage generated from the voltage generator 150, to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The read or program operation of the semiconductor memory device 100 may be performed on a page basis. Addresses received in a request for a read or program operation may include a block address, a row address and a column address. The address decoder 120 may select one memory block and one word line based on the block address and the row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm. During a read operation or a program verify operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a program status of a corresponding memory cell and latch it as sensing data. The read/write circuit 130 is operated in response to page buffer control signals outputted from the control logic 140.

During a read operation, the read/write circuit 130 may sense data of the memory cells and temporarily store readout data, and then output data DATA to the input/output buffer (not shown) of the semiconductor memory device 100. In an embodiment, the read/write circuit 130 may include a column select circuit or the like as well as the page buffers (or page registers).

The control logic 140 is coupled to the address decoder 120, the read/write circuit 130, and the voltage generator 150. The control logic 140 may receive a command CMD and a control signal CTRL through the input/output buffer (not shown) of the semiconductor memory device 100. The control logic 140 may control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110.

The voltage generator 150 may generate a read voltage Vread and a pass voltage Vpass during a read operation in response to a control signal outputted from the control logic 140. The voltage generator 150 may include, so as to generate a plurality of voltages having various voltage levels, a plurality of pumping capacitors configured to receive an internal source voltage and may generate a plurality of voltages by selectively enabling the plurality of pumping capacitors under control of the control logic 140. As described above, the voltage generator 150 may include a charge pump (not shown). The charge pump may include a plurality of pumping capacitors described above. The detailed configuration of the charge pump included in the voltage generator 150 may be designed in various ways, as needed.

In detail, the voltage generator 150 may precharge the charge pump based on a precharge signal $SIG_{PRC}$ received from the control logic 140. The precharge operation of the charge pump may change depending on the kind of received command. In other words, since voltages which are used to perform the read operation, the program operation, or the erase operation of the semiconductor memory device 100 may differ from each other, the precharge operation of the charge pump may also change depending on commands.

The voltage generator 150 may discharge the charge pump based on a discharge signal $SIG_{DSC}$ received from the control logic 140. As described above, since the precharge operation of the charge pump may change depending on the type of command, when an operation corresponding to a received command CMD is completed, the control logic 140 may send a discharge signal $SIG_{DSC}$ to the voltage generator 150 to discharge the charge pump in the voltage generator 150.

The address decoder 120, the read/write circuit 130, and the voltage generator 150 may function as peripheral circuits for performing a read operation, a write operation, or an erase operation on the memory cell array 110. The peripheral circuits may perform a read operation, a write operation, or an erase operation on the memory cell array 110 under control of the control logic 140.

In the conventional case, when a plurality of commands CMD are applied to the semiconductor memory device 100, the control logic 140 precharges, before start of an operation corresponding to each command CMD, the charge pump of the voltage generator 150 to generate an operation voltage corresponding to the associated command CMD, and discharges the charge pump after the operation corresponding to the associated command CMD has been completed. Therefore, when a plurality of read operations are successively performed, the operation efficiency may be reduced due to the precharge and discharge operations performed as many time as the number of the plurality of read operations. For example, if a plurality of read commands are successively transmitted to the semiconductor memory device 100, the charge pump is precharged and discharged every time a read operation is performed among the read operations corresponding to the plurality of read commands. Thus, unnecessary discharge and precharge operations may be performed, whereby the speed of successive read operations may be reduced.

In an embodiment of the present disclosure, when a discharge operation of the semiconductor memory device 100 is needed, the memory controller 200 generates a discharge command $CMD_{DSC}$ and transmits it to the semiconductor memory device 100. The control logic 140 of the semiconductor memory device 100 monitors a current status of the voltage generator 150, generates a precharge signal $SIG_{PRC}$ when a new operation is needed while the charge pump of the voltage generator 150 is in a discharged status, and then transmits the precharge signal $SIG_{PRC}$ to the voltage generator 150. Thereby, the charge pump of the voltage generator 150 may be precharged under control of the control logic 140. Based on the received discharge command $CMD_{DSC}$, the control logic 140 of the semiconductor memory device 100 generates a discharge signal $SIG_{DSC}$ and transmits it to the voltage generator 150. Thereby, the charge pump of the voltage generator 150 may be discharged under control of the memory controller 200.

As a result, the charge pump of the voltage generator 150 may be controlled such that the discharge operation of the charge pump is performed under control of the memory controller 200, and the precharge operation of the voltage generator 150 is performed based on the status of the charge pump under control of the control logic 140 of the semiconductor memory device 100. In addition, when successive read commands $CMD_{RD}$ are transmitted to the semiconductor memory device 100, the memory controller 200 skips transmission of the discharge command $CMD_{DSC}$ to prevent unnecessary discharge operation and precharge operation from being performed. As a result, the overall read operation speed of the semiconductor memory device 100 may be enhanced.

Figure 3:
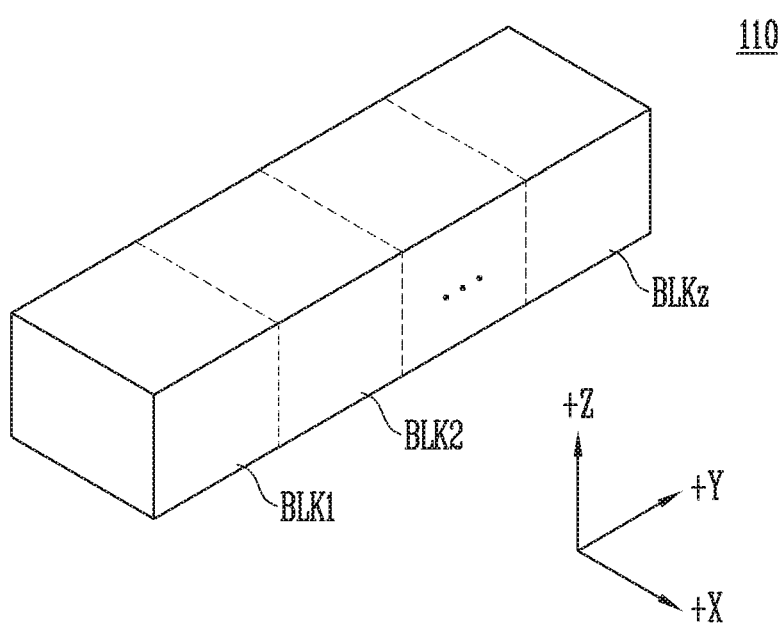
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 may include a plurality of memory blocks BLK1 to BLKz. Each memory block may have a two-dimensional or a three-dimensional structure. When, as shown in FIG. 3, the memory blocks have a three-dimensional structure, each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
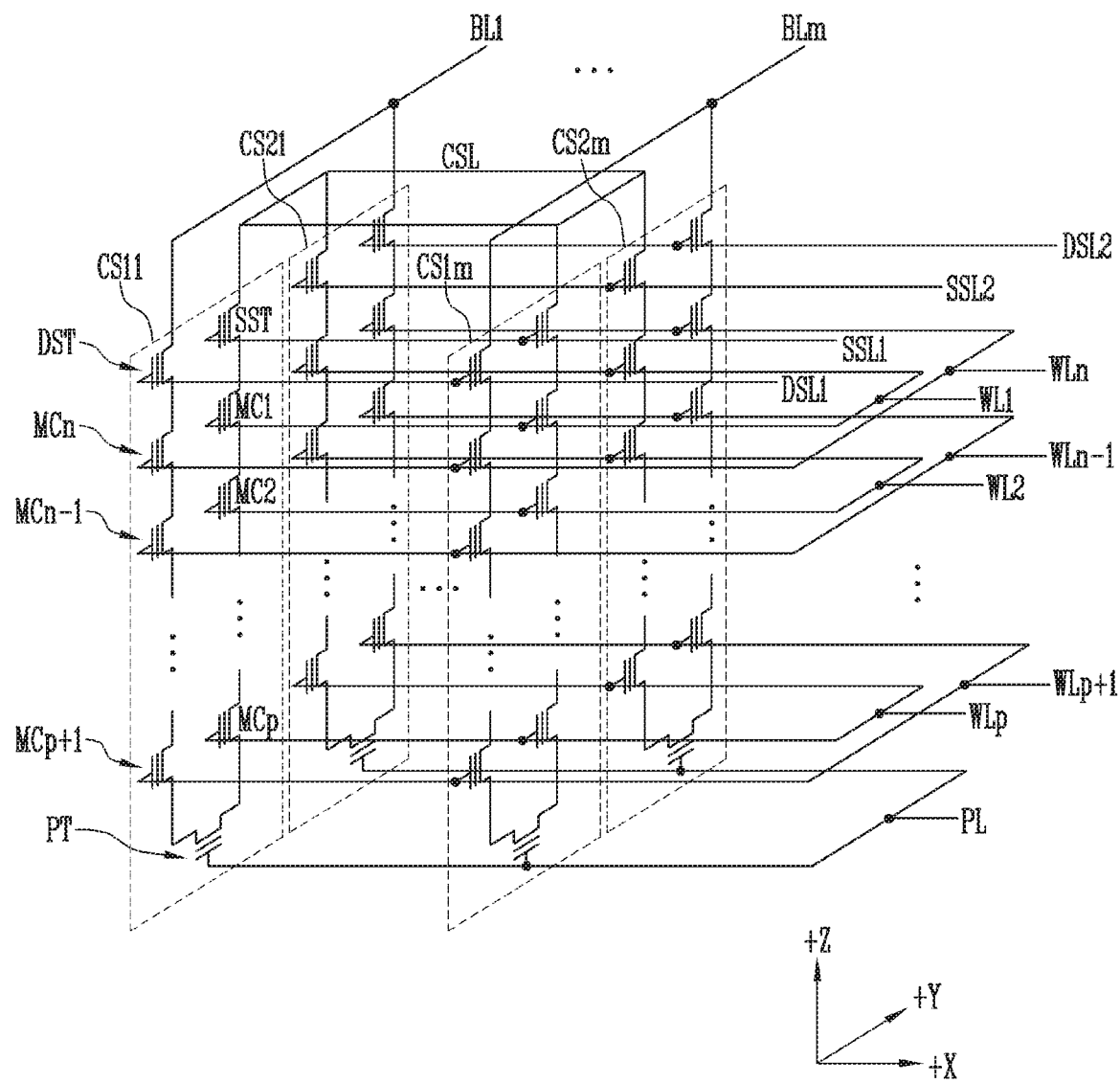
FIG. 4 is a circuit diagram illustrating any one memory block BLKa of memory blocks BLK1 to BLKz of FIG. 3, in accordance with an embodiment of the present disclosure.

FIG. 4 is a circuit diagram illustrating any one memory block BLKa of memory blocks BLK1 to BLKz of FIG. 3, in accordance with an embodiment of the present disclosure.

Referring to FIG. 4, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 4, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, the source select transistors of the cell strings CS11 to CS1$m$ and CS21 to CS2$m$ may be coupled in common to a single source select line.

The first to nth memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to nth memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1$m$ in the first row are coupled to a first drain select line DSL1. Drain select transistors of the cell strings CS21 to CS2$m$ in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1$m$ and CS2$m$ in an m-th column are coupled to an m-th bit line BLm.

Memory cells coupled to the same word line in cell strings arranged in the row direction form a single page. For example, memory cells coupled to the first word line WL1, among the cell strings CS11 to CS1$m$ in the first row, form a single page. Memory cells coupled to the first word line WL1, among the cell strings CS21 to CS2$m$ in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from the selected cell strings.

In an embodiment, even bit lines and odd bit lines may be provided in lieu of the first to m-th bit lines BL1 to BLm. Even-number-th cell strings of the cell strings CS11 to CS1$m$ or CS21 to CS2$m$ arranged in the row direction may be coupled to respective even bit lines. Odd-number-th cell strings of the cell strings CS11 to CS1$m$ or CS21 to CS2$m$ arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
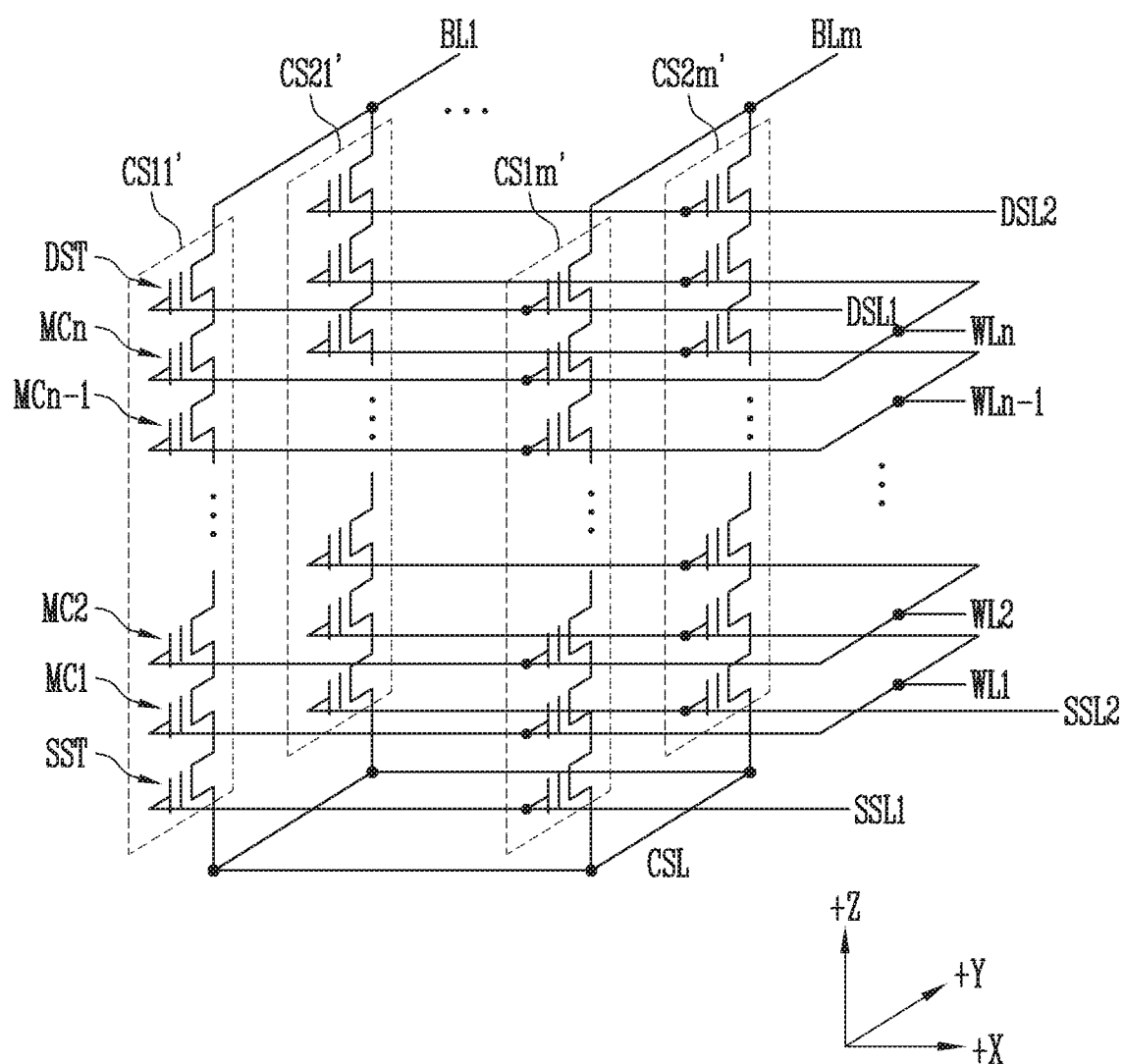
FIG. 5 is a circuit diagram illustrating any one memory block BLKb of the memory blocks BLK1 to BLKz of FIG. 3, in accordance with an embodiment of the present disclosure.

FIG. 5 is a circuit diagram illustrating any one memory block BLKb of the memory blocks BLK1 to BLKz of FIG. 3, in accordance with an embodiment of the present disclosure.

Referring to FIG. 5, the memory block BLKb may include a plurality of cell strings CS11' to CS1$m$' and CS21' to CS2$m$'. Each of the cell strings CS11' to CS1$m$' and CS21' to CS2$m$' extends in the +Z direction. Each of the cell strings CS11' to CS1$m$' and CS21' to CS2$m$' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

As a result, the memory block BLKb of FIG. 5 may have a circuit similar to that of the memory block BLKa of FIG. 4. For example, a pipe transistor PT may be excluded from each cell string in the memory block BLKb of FIG. 5, whereas the pipe transistor PT may be included in the memory block BLKa of FIG. 4.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
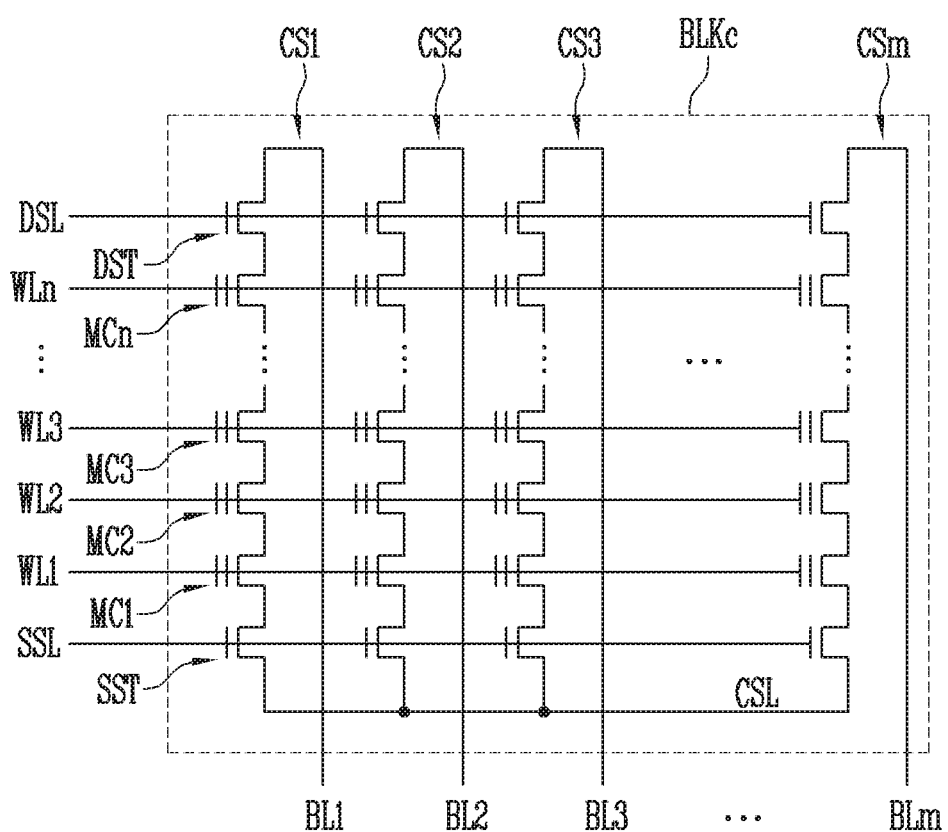
FIG. 6 is a circuit diagram illustrating any one memory block BLKc of the memory blocks BLK1 to BLKz included in the memory cell array 110 of FIG. 2, in accordance with an embodiment of the present disclosure.

FIG. 6 is a circuit diagram illustrating any one memory block BLKc of the memory blocks BLK1 to BLKz included in the memory cell array 110 of FIG. 2, in accordance with an embodiment of the present disclosure.

Referring to FIG. 6, the memory block BLKc includes a plurality of cell strings CS1 to CSm. The plurality of cell strings CS1 to CSm may be respectively coupled to a plurality of bit lines BL1 to BLm. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

Memory cells coupled to the same word line may form a single page. The cell strings CS1 to CSm may be selected by selecting the drain select line DSL. When any one of the word lines WL1 to WLn is selected, a corresponding single page may be selected from the selected cell strings.

In an embodiment, even bit lines and odd bit lines may be provided in lieu of the first to m-th bit lines BL1 to BLm. Even-number-th cell strings of the cell strings CS1 to CSm may be coupled to the respective even bit lines, and odd-number-th cell strings may be coupled to the respective odd bit lines.

Figure 7:
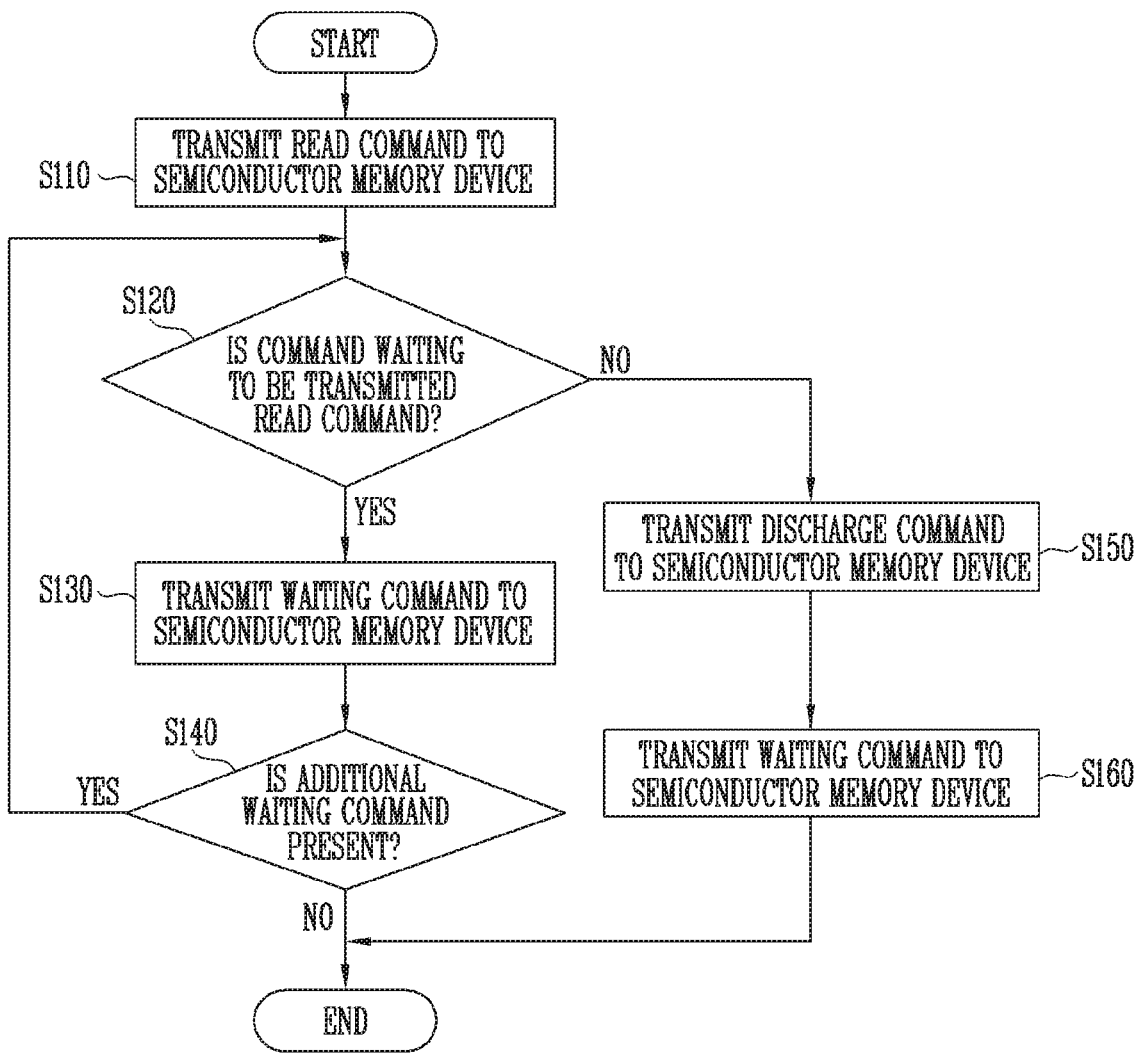
FIG. 7 is a flowchart describing a method of operating a memory controller 200 in accordance with an embodiment of the present disclosure.
Figure 8:
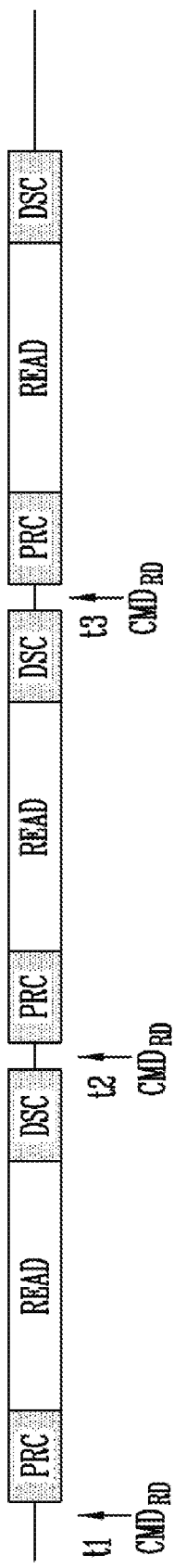
FIG. 8 is a diagram illustrating the operation of the semiconductor memory device 200 according to a typical method of operating a memory controller.
Figure 9:
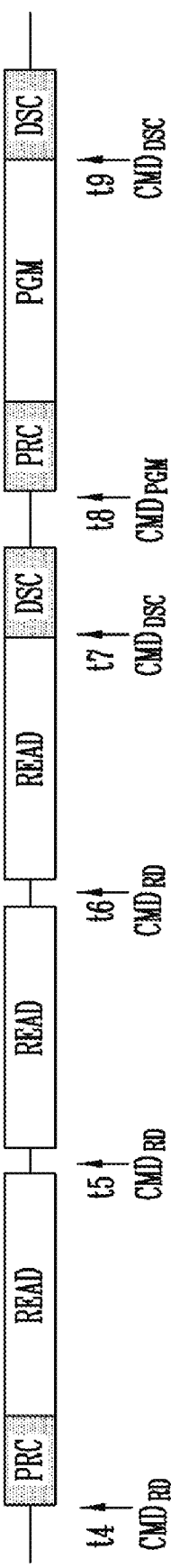
FIG. 9 is a diagram illustrating the operation of the semiconductor memory device which is controlled according to the method of operating the memory controller 200 shown in FIG. 7.

FIG. 7 is a flowchart describing a method of operating the memory controller 200 in accordance with an embodiment of the present disclosure. FIG. 8 is a diagram illustrating the operation of the semiconductor memory device according to a typical method of operating a memory controller. FIG. 9 is a diagram illustrating the operation of the semiconductor memory device which is controlled according to the method of operating the memory controller 200 shown in FIG. 7. Hereinafter, a method of operating the memory controller 200 in accordance with an embodiment of the present disclosure will be described with reference to FIGS. 7 to 9.

Referring to FIG. 8, at time t1, a read command $CMD_{RD}$ is transmitted from the memory controller to a semiconductor memory device. Then, a control logic of the semiconductor memory device generates a precharge signal $SIG_{PRC}$ for a read operation and transmits it to the voltage generator. Thus, during a precharge section PRC, a precharge operation of the voltage generator is performed.

After the precharge operation of a voltage generator has been completed, the read operation of the semiconductor memory device is performed during a read operation READ. By the precharge operation during the precharge section PRC, the voltage generator may generate voltages, e.g., a read voltage Vread and a pass voltage Vpass, needed for the read operation. A control logic controls peripheral circuits and performs the read operation.

After the read section READ has been completed, a discharge operation of the voltage generator is performed during a discharge section DSC. To this end, the control logic generates a discharge signal $SIG_{DSC}$ and transmits it to the voltage generator.

The read operation is completed by completing the discharge operation. If an additional read operation of the semiconductor memory device is needed, the memory controller may transmit a read command $CMD_{RD}$ to the semiconductor memory device again, at time t2. Then, as described above, the read operation is performed through a precharge section PRC, a read section READ, and a discharge section DSC.

If an additional read operation of the semiconductor memory device is needed again, the memory controller may transmit a read command $CMD_{RD}$ to the semiconductor memory device again, at time t3. Then, as described above, the read operation is performed through a precharge section PRC, a read section READ, and a discharge section DSC.

As shown in FIG. 8, according to the conventional operating method of a memory controller and a semiconductor memory device, when the memory controller transmits successive read commands $CMD_{RD}$ to the semiconductor memory device, unnecessary discharge sections DSC and precharge sections PRC are generated between read operations. Thereby, the overall read time of the semiconductor memory device is increased. Consequently, the operating speed of the semiconductor memory device is reduced. Hereinafter, a method of operating the memory controller and the semiconductor memory device in accordance with an embodiment of the present disclosure will be described with reference to FIGS. 7 and 9.

If a read request is received form the host 300, the memory controller 200 transmits a read command $CMD_{RD}$ corresponding to the read request to the semiconductor memory device 100, at step S110. If the read command $CMD_{RD}$ is transmitted to the semiconductor memory device 100, the control logic 140 of the semiconductor memory device 100 determines whether to transmit a precharge signal $SIG_{PRC}$. If the charge pump of the voltage generator 150 is in a discharged status, the control logic 140 transmits the precharge signal $SIG_{PRC}$ to the voltage generator 150 to precharge the charge pump. As shown in FIG. 9, at time t4, the memory controller 200 may transmit a read command $CMD_{RD}$ to the semiconductor memory device 100. If the read command $CMD_{RD}$ is received, the control logic 140 of the semiconductor memory device 100 transmits a precharge signal $SIG_{PRC}$ to the voltage generator 150. Thereafter, during a precharge section PRC, a precharge operation of the voltage generator 150 is performed.

If the precharge operation is completed, the control logic 140 of the semiconductor memory device 100 controls the voltage generator 150, the address decoder 120, and the read/write circuit 130 to perform a read operation corresponding to the received read command $CMD_{RD}$ during the read section READ.

After the read operation according to the read command transmitted at step S110 has been completed, the semiconductor memory device 100 waits for a command from the memory controller 200 without performing a discharge operation of the voltage generator 150.

At step S120, the memory controller 200 determines whether a command waiting to be transmitted to the semiconductor memory device 100 is a read command. The memory controller 200 may include a command queue (not shown). Commands to be transmitted to the semiconductor memory device 100 may be queued in the command queue. With reference to the command queue, the memory controller 200 may determine whether a command to be transmitted to the semiconductor memory device 100 is a read command.

If, as a result of the determination of step S120, it is determined that the command waiting to be transmitted is a read command (that is, "YES" at step S120), there is no need to discharge the charge pump of the voltage generator 150, and the voltage generator 150 that is currently in the precharged status may be allowed to generate voltages for that read operation. Consequently, at step S130, the command, i.e., the read command, waiting to be transmitted is transmitted to the semiconductor memory device 100. As a result, unnecessary discharge section DSC and precharge section PRC are omitted. At time t5, the semiconductor memory device 100 may receive the read command $CMD_{RD}$ waiting to be transmitted, without receiving a discharge command $CMD_{DSC}$. Therefore, the semiconductor memory device 100 performs a read operation corresponding to the read command $CMD_{RD}$ received at step S130, without performing a discharge operation or a precharge operation of the voltage generator 150.

Thereafter, at step S140, it is determined whether an additional waiting command is present. If there is no waiting command (that is, "NO" at step S140), the operation of the memory controller may be terminated. However, if a waiting command is present (that is, "YES" at step S140), the process proceeds to step S120 again, and it is determined whether the command waiting to be transmitted is a read command.

If, as a result of the determination of step S120, it is determined that the command waiting to be transmitted is also a read command $CMD_{RD}$, the memory controller 200 may transmit the corresponding read command $CMD_{RD}$ to the semiconductor memory device 100, at step S130. Thereby, at time t6, the semiconductor memory device 100 may receive the read command $CMD_{RD}$ and perform a read operation corresponding to the read command $CMD_{RD}$. Thereafter, step S140 is repeated.

If, as a result of the determination of step S120, the command waiting to be transmitted is not a read command (that is, "NO" at step S120), the memory controller 200 transmits a discharge command $CMD_{DSC}$ to the semiconductor memory device 100, at step S150, before transmitting the command waiting to be transmitted, to the semiconductor memory device 100. Referring to FIG. 9, a case where, after a third read operation has been performed, a command waiting to be transmitted is a program command $CMD_{PGM}$ is illustrated. Therefore, the memory controller 200 transmits a discharge command $CMD_{DSC}$ to the semiconductor memory device 100 before transmitting the program command $CMD_{PGM}$ waiting to be transmitted.

In detail, at time t7, the semiconductor memory device 100 receives a discharge command $CMD_{DSC}$. Then, the control logic 140 may transmit a discharge signal $SIG_{DSC}$ to the voltage generator 150. Based on the discharge signal $SIG_{DSC}$, the voltage generator 150 performs a discharge operation during a discharge section DSC.

Subsequently, at time t8, the memory controller 200 transmits a command, i.e., a program command $CMD_{PGM}$, waiting to be transmitted, to the semiconductor memory device 100, at step S160. The semiconductor memory device 100 receives the program command $CMD_{PGM}$. Since the voltage generator 150 is in a discharged status at time t8, the control logic 140 may transmit a precharge signal $SIG_{PRC}$ to the voltage generator 150. Based on the precharge signal $SIG_{PRC}$, the voltage generator 150 performs a precharge operation during a precharge section PRC.

After the precharge operation has been completed, the semiconductor memory device 100 performs, based on a received program command $CMD_{PGM}$, a program operation during a program section PGM.

After the program operation has been completed, the voltage generator 150 needs to be discharged. Although not shown in FIG. 7, the memory controller 200 may transmit a discharge command $CMD_{DSC}$ to the semiconductor memory device 100. At time t9 of FIG. 9, the semiconductor memory device 100 receives a discharge command $CMD_{DSC}$. Then, the control logic 140 may transmit a discharge signal $SIG_{DSC}$ to the voltage generator 150. Based on the discharge signal $SIG_{DSC}$, the voltage generator 150 performs a discharge operation during a discharge section DSC.

Referring to steps S120, S130, S140, S150, and S160, in the method of operating the memory controller 200 in accordance with an embodiment of the present disclosure, it is to be noted that, based on the type of command waiting to be transmitted after the read command transmitting operation of step S110, it is determined whether to transmit a discharge command. For instance, as a result of the determination of step S120, it is determined that the command waiting to be transmitted is a read command, the read command waiting to be transmitted may be transmitted to the semiconductor memory device 100 without transmission of other commands (e.g., a discharge command or a precharge command), at step S130. Alternatively, if, as a result of the determination of step S120, the command waiting to be transmitted is not a read command, a discharge command $CMD_{DSC}$ may be generated and transmitted to the semiconductor memory device 100, at step S150.

As described above, in the method of operating the memory controller in accordance with an embodiment of the present disclosure, after the read operation of the semiconductor memory device 100 has been performed, it is determined whether to transmit a discharge command $CMD_{DSC}$ based on the type of command to be transmitted to the semiconductor memory device 100. Thereby, unnecessary discharge and precharge operations of the voltage generator 150 may be omitted between successive read operations.

Particularly, referring to FIG. 9, it is to be noted that the overall read time of the semiconductor memory device 100 is reduced because discharge sections DSC and precharge sections PRC are removed between the successive read sections READ. Consequently, the operating speeds of the semiconductor memory device 100 and the storage device 10 including the semiconductor memory device 100 may be enhanced.

The control logic 140 of the semiconductor memory device 100 in accordance with an embodiment of the present disclosure may control a discharge operation of the voltage generator based on a command received after a read operation has been performed on the memory cell array 110. In this case, the memory controller 200 may transmit only typical read command $CMD_{RD}$, program command $CMD_{PGM}$, etc. to the semiconductor memory device 100 rather than generating a discharge command $CMD_{DSC}$. In this embodiment, the control logic 140 of the semiconductor memory device 100 determines whether to perform a discharge operation and a precharge operation of the voltage generator 150 based on received commands.

Figure 10:
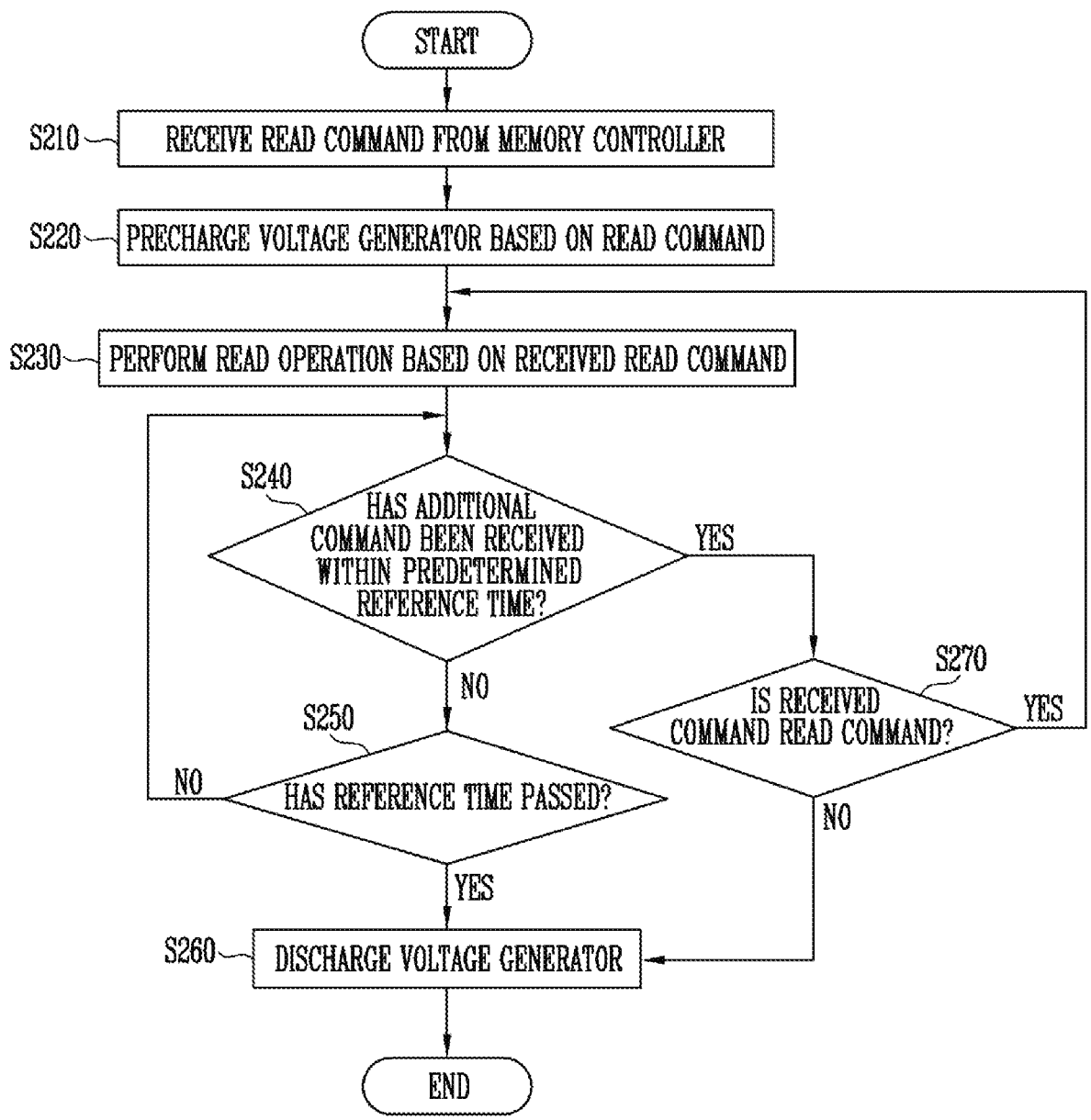
FIG. 10 is a flowchart describing a method of operating the semiconductor memory device 100 in accordance with an embodiment of the present disclosure.
Figure 11:
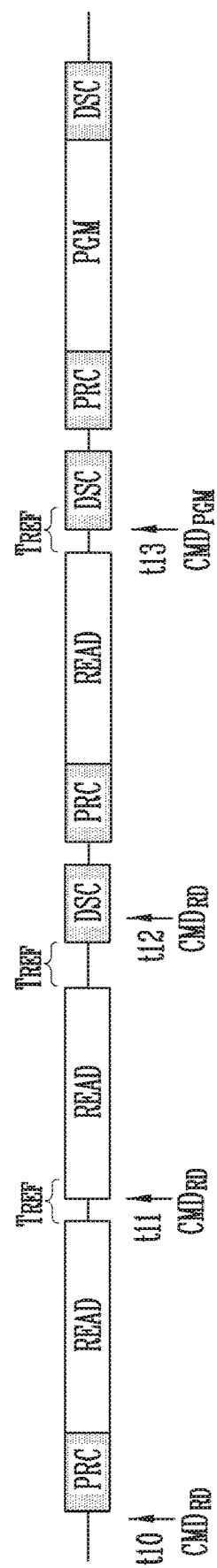
FIG. 11 is a diagram illustrating the operation of the semiconductor memory device 100 according to the method shown in FIG. 10.

FIG. 10 is a flowchart describing a method of operating the semiconductor memory device 100 in accordance with an embodiment of the present disclosure. FIG. 11 is a diagram illustrating the operation of the semiconductor memory device 100 according to the method shown in FIG. 10. Hereinafter, the method of operating the semiconductor memory device 100 in accordance with an embodiment of the present disclosure will be described with reference to FIGS. 10 and 11.

At step S210, the semiconductor memory device 100 receives a read command $CMD_{RD}$ from the memory controller 200. As shown in FIG. 11, at time t10, the semiconductor memory device 100 may receive a read command $CMD_{RD}$. Then, based on the received read command $CMD_{RD}$, the semiconductor memory device 100 may precharge, during a precharge section PRC, the voltage generator to generate a read voltage to be used for a read operation, at step S220.

Thereafter, at step S230, during a read section READ, a read operation is performed based on the received read command $CMD_{RD}$. If the read operation is completed, the control logic 140 determines whether an additional command has been received within a predetermined reference time $T_{REF}$ from the completion time of the read operation, at step S240. To determine whether an additional command has been received within the reference time $T_{REF}$, the control logic 140 may internally include a timer (not shown) for determining whether the reference time $T_{REF}$ has passed.

Referring to FIG. 11, at time t11 that is within the reference time $T_{REF}$ from the completion time of the first read operation, a read command $CMD_{RD}$ is received. Since an additional command has been received within a predetermined reference time $T_{REF}$ from the completion time of the read operation (that is, "YES" at step S240) the process proceeds from step S240 to step S270 to determine whether the received command is a read command. Since the command received at time t11 of FIG. 11 is a read command $CMD_{RD}$ (that is, "YES" at step S270), the process may proceed to step S230 to perform a read operation corresponding to the received read command $CMD_{RD}$. In this way, successive read operations may be performed without performing a discharge operation and a precharge operation of the voltage generator 150.

If the second read operation is completed at step S230, the process proceeds to step S240 again to determine whether an additional command has been received within the reference time $T_{REF}$. Referring to FIG. 11, since an additional command has not been received within the reference time $T_{REF}$ (that is, "NO" at step S240), the process proceeds to step S250 to determine whether the reference time $T_{REF}$ has passed. Since the additional command is received after the reference time $T_{REF}$ passes after the second read operation has been completed (that is, "YES" at step S250), the process proceeds to step S260 as a result of the determination of step S250, in which the voltage generator 150 is discharged. Referring to FIG. 11, although at time t12 the semiconductor memory device 100 receives a read command $CMD_{RD}$, this is after the reference time $T_{REF}$ has passed from the completion time of the second read operation. Thus, the reception of the read command $CMD_{RD}$ at time t12 corresponds to step S210 of FIG. 10.

Hence, after a discharge section DSC has passed, the process proceeds to step S220 to precharge the voltage generator 150 based on the received read command $CMD_{RD}$, and then proceeds to step S230 to perform a read operation.

At step S240, it is determined whether an additional command has been received within the reference time $T_{REF}$ from the completion time of the third read operation. Because a program command $CMD_{PGM}$ is received within the reference time $T_{REF}$ at time t13 of FIG. 11 (that is, "YES" at step S240), the process proceeds to step S270 to determine whether the received command is a read command.

Since the command received at time t13 is the program command $CMD_{PGM}$ rather than a read command (that is, "NO" at step S270), the process proceeds to step S260 to discharge the voltage generator 150.

Subsequently, as shown in FIG. 11, after the discharge operation has been completed during a discharge section DSC, a precharge operation corresponding to a program command $CMD_{PDM}$ received during a precharge section PRC is performed. Thereafter, a program operation is performed during a program section PGM. Lastly, a discharge operation is performed during a discharge section DSC.

Figure 12:
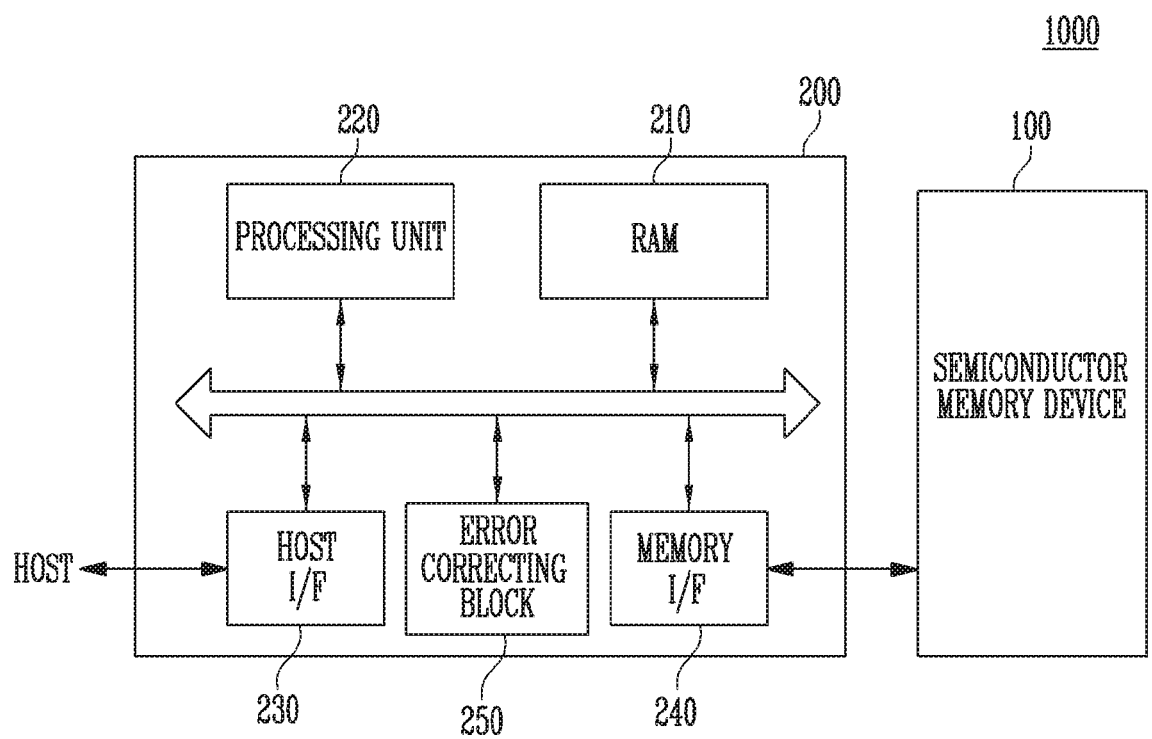
FIG. 12 is a block diagram illustrating an example of the memory controller shown in FIG. 1.

FIG. 12 is a block diagram illustrating an example of the memory controller 200 shown in FIG. 1.

Referring to FIG. 12, the memory controller 200 is coupled with a semiconductor memory device 100 and a host HOST. The semiconductor memory device 100 may be the semiconductor memory device described with reference to FIG. 2. The memory controller 200 corresponds to the memory controller 200 of FIG. 1. Hereinafter, repetitive explanations will be omitted.

The memory controller 200 may access the semiconductor memory device 100 in response to a request from the host HOST. For example, the memory controller 200 may control a read operation, a write operation, an erase operation, and a background operation of the semiconductor memory device 100. The memory controller 200 may provide an interface between the host HOST and the semiconductor memory device 100. The memory controller 200 may drive firmware for controlling the semiconductor memory device 100.

The memory controller 200 may include a random access memory (RAM) 210, a processing unit 220, a host interface 230, a memory interface 240, and an error correcting block 250. The RAM 210 may be used as at least one of an operating memory for the processing unit 220, a cache memory between the semiconductor memory device 100 and the host HOST, and a buffer memory between the semiconductor memory device 100 and the host HOST. The RAM 210 may be used as a command queue for temporarily storing commands to be transmitted to the semiconductor memory device 100.

The processing unit 220 may control the overall operation of the memory controller 200.

The host interface 230 may include a protocol for performing data exchange between the host HOST and the controller 200. In an embodiment, the memory controller 200 may communicate with the host HOST through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 240 may interface with the semiconductor memory device 100. For example, the memory interface may include a NAND interface or a NOR interface.

The error correcting block 250 may use an error correcting code (ECC) to detect and correct an error in data received from the semiconductor memory device 100. The processing unit 220 may control the semiconductor memory device 100 to adjust the read voltage according to an error detection result from the error correcting block 250 and perform re-reading. In an embodiment, the error correcting block 250 may be provided as a component of the memory controller 200.

The memory controller 200 and the semiconductor memory device 100 may be integrated into a single semiconductor device. In an embodiment, the memory controller 200 and the semiconductor memory device 100 may be integrated into a single semiconductor device to form a memory card. For example, the memory controller 200 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), and a universal flash storage (UFS).

The memory controller 200 and the semiconductor memory device 100 may be integrated into a single semiconductor device to form a solid state drive (SSD). The SSD may include a storage device configured to store data to a semiconductor memory. When the storage device including the memory controller 1200 and the semiconductor memory device 100 is used as the SSD, the operating speed of the host HOST coupled to the storage device can be phenomenally improved.

In an embodiment, the storage device including the memory controller 200 and the semiconductor memory device 100 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 and the storage device including the semiconductor memory device 100 may be embedded in various types of packages. For example, the semiconductor memory device 100 or the storage device may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 13:
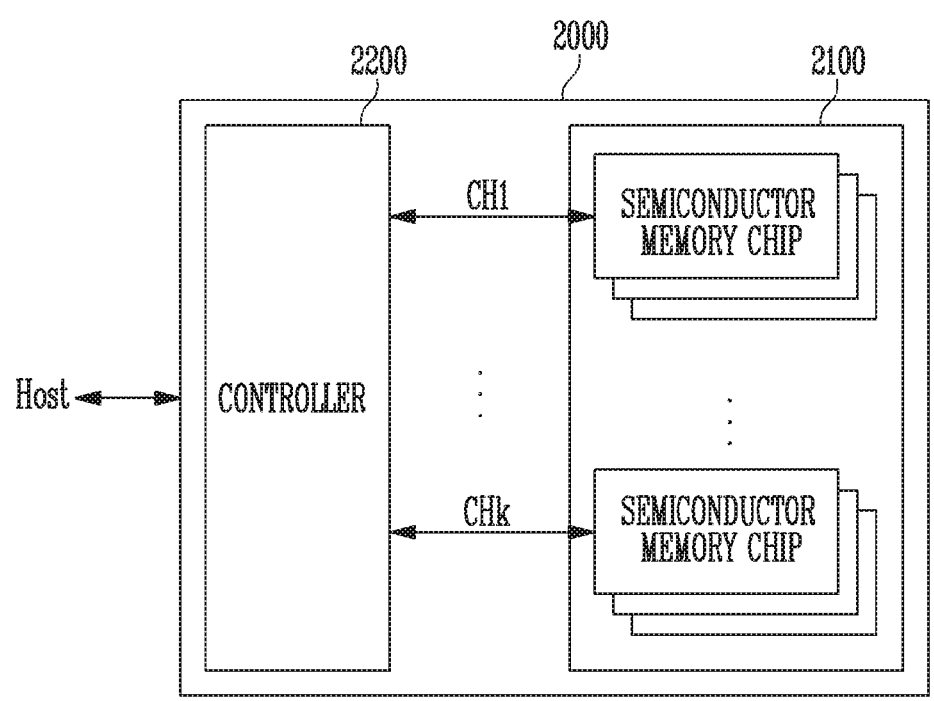
FIG. 13 is a block diagram illustrating an application example of the storage device of FIG. 1.

FIG. 13 is a block diagram illustrating an application example of the storage device 2000 of FIG. 1.

Referring FIG. 13, the storage device 2000 includes the semiconductor memory device 2100 and a controller 2200. The semiconductor memory device 2100 may include a plurality of semiconductor memory chips. The semiconductor memory chips are divided into a plurality of groups.

In FIG. 13, it is illustrated that the respective groups communicate with the controller 2200 through first to k-th channels CH1 to CHk. Each semiconductor memory chip may be configured and operated in the same manner as those of the semiconductor memory device 100 described with reference to FIG. 2.

Each group may communicate with the controller 2200 through one common channel. The controller 2200 may have the same configuration as that of the memory controller 200 described with reference to FIG. 13 and control a plurality of memory chips of the semiconductor memory device 2100 through the plurality of channels CH1 to CHk.

Figure 14:
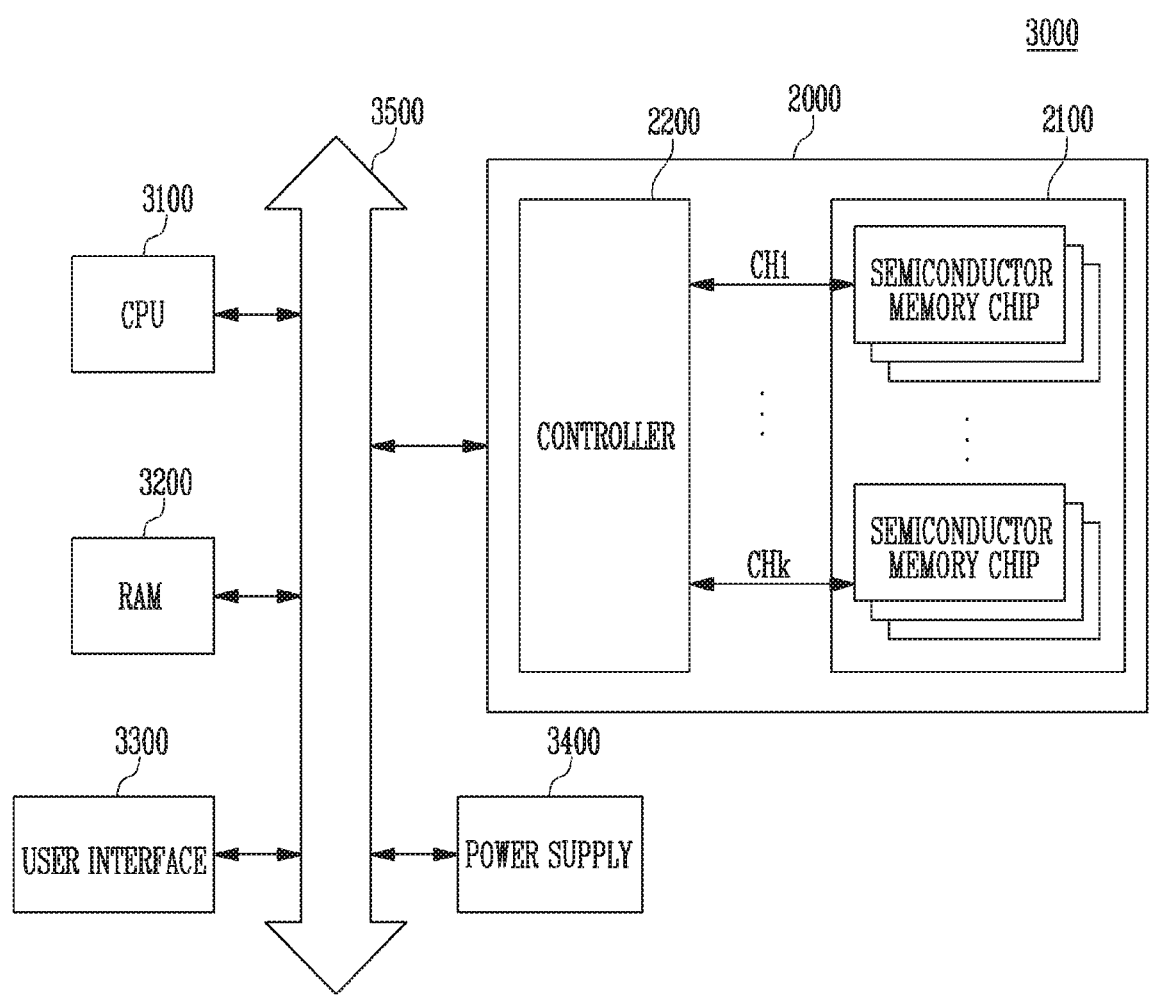
FIG. 14 is a block diagram illustrating a computing system including the storage device described with reference to FIG. 13.

FIG. 14 is a block diagram illustrating a computing system 3000 including the storage device 2000 described with reference to FIG. 13.

The computing system 3000 may include a central processing unit (CPU) 3100, a RAM 3200, a user interface 3300, a power supply 3400, a system bus 3500, and the storage device 2000.

The storage device 2000 may be electrically coupled to the CPU 3100, the RAM 3200, the user interface 3300, and the power supply 3400 through the system bus 3500. Data provided through the user interface 3300 or processed by the CPU 3100 may be stored in the storage device 2000.

In FIG. 14, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

Referring to FIG. 14, the storage device 2000 described with reference to FIG. 13 may be provided. However, the storage device 2000 may be replaced with the storage device including the memory controller 200 and the semiconductor memory device 100 that has been described with reference to FIG. 12.

Various embodiments of the present disclosure may provide a method of operating a memory controller capable of improving an operating speed of a semiconductor memory device.

Various embodiments of the present disclosure may provide a storage device having an improved operating speed.

Various embodiments of the present disclosure may provide a semiconductor memory device having an improved operating speed.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a memory controller to control an operation of a semiconductor memory device, the method comprising:
transmitting a first read command to the semiconductor memory device; and
determining whether to generate a discharge command based on a type of command waiting to be transmitted after the first read command.

2. The method according to claim 1,
wherein the determining comprises determining not to generate the discharge command when the command waiting to be transmitted is a second read command,
the method further comprising transmitting the second read command to the semiconductor memory device after the determining.

3. The method according to claim 1,
wherein the determining comprises determining to generate the discharge command when the command waiting to be transmitted is a program command or an erase command,
the method further comprising, after the determining:
generating the discharge command and transmitting the discharge command to the semiconductor memory device; and
transmitting to the semiconductor memory device the command waiting to be transmitted.

4. The method according to claim 3, further comprising generating the discharge command and transmitting the discharge command to the semiconductor memory device after the transmitting.

5. A storage device comprising:
a semiconductor memory device including a voltage generator configured to generate a plurality of operating voltages; and
a memory controller configured to control an operation of the semiconductor memory device,
wherein the memory controller controls the semiconductor memory device such that a precharge operation and a discharge operation of the voltage generator are omitted, when the semiconductor memory device performs successive read operations, between the successive read operations.

6. The storage device according to claim 5, wherein the memory controller controls the semiconductor memory device to discharge the voltage generator based on a discharge command.

7. The storage device according to claim 6, wherein the memory controller determines, when the read operation of the semiconductor memory device is completed, whether to generate the discharge command based on a command waiting to be transmitted.

8. The storage device according to claim 7, wherein the memory controller transmits to the semiconductor memory device, when the command waiting to be transmitted is a read command, the command waiting to be transmitted without generating the discharge command.

9. The storage device according to claim 7, wherein the memory controller generates, when the command waiting to be transmitted is not a read command, the discharge command and transmits the discharge command to the semiconductor memory device and then transmits to the semiconductor memory device the command waiting to be transmitted.

10. A semiconductor memory device comprising:
a memory cell array;
is a voltage generator configured to generate a voltage for performing an operation on the memory cell array; and
a control logic configured to control an operation of the voltage generator, wherein the control logic is configured to control a discharge operation of the voltage generator based on a command received after a read operation on the memory cell array.

11. The semiconductor memory device according to claim 10, wherein the control logic controls, when a read command is received within a predetermined reference time after the read operation is completed, the voltage generator to perform a read operation corresponding to the received read command without performing the discharge operation of the voltage generator.

12. The semiconductor memory device according to claim 10, wherein the control logic controls, when a command other than a read command is received after the read operation is completed, the voltage generator to perform a discharge operation and a precharge operation and then perform an operation based on the received command.

13. The semiconductor memory device according to claim 10, wherein the control logic controls, when a command is not received within a predetermined reference time after the read operation is completed, the voltage generator to perform a discharge operation.

14. A memory system comprising:
a memory cell array;
a peripheral circuit;
a control logic configured to control the peripheral circuit to selectively perform precharge, read and discharge operations to the memory cell array; and
a controller configured to provide the control logic with a discharge command during a plurality of successive read operations,
wherein the control logic controls, in response to the discharge command, the peripheral circuit to skip discharge and precharge operations between the successive read operations.

15. A memory device comprising:
a memory cell array;
a peripheral circuit; and
a control logic configured to control the peripheral circuit to perform a read operation to the memory cell array,
wherein the control logic controls the peripheral circuit to perform a discharge operation for a preceding read operation and a precharge operation for a subsequent read operation when a read command is not provided for the subsequent read operation within a predetermined time after the preceding read operation is completed.

* * * * *